United States Patent
Sharma et al.

(10) Patent No.: US 10,374,033 B1
(45) Date of Patent: Aug. 6, 2019

(54) SEMICONDUCTOR ASSEMBLIES HAVING SEMICONDUCTOR MATERIAL REGIONS WITH CONTOURED UPPER SURFACES

(71) Applicant: Micron Technology, Inc., Boise, ID (US)

(72) Inventors: Pranav P. Sharma, Boise, ID (US); Vinay Nair, Boise, ID (US); Sanjeev Sapra, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 15/915,158

(22) Filed: Mar. 8, 2018

(51) Int. Cl.
  *H01L 29/06* (2006.01)
  *H01L 23/64* (2006.01)
  *H01L 27/108* (2006.01)
  *H01L 29/20* (2006.01)
  *H01L 29/161* (2006.01)

(52) U.S. Cl.
  CPC ........ *H01L 29/0657* (2013.01); *H01L 23/642* (2013.01); *H01L 27/10805* (2013.01); *H01L 29/161* (2013.01); *H01L 29/20* (2013.01)

(58) Field of Classification Search
  CPC ... H01L 29/0657; H01L 29/161; H01L 29/20; H01L 23/642; H01L 27/10805
  See application file for complete search history.

(56) References Cited

U.S. PATENT DOCUMENTS

| 2008/0157194 | A1 | 7/2008 | Lee et al. | |
| 2008/0205133 | A1 | 8/2008 | Gonzalez et al. | |
| 2009/0174039 | A1* | 7/2009 | Lee | H01L 29/42376 257/622 |
| 2013/0043519 | A1 | 2/2013 | Moon et al. | |
| 2016/0190133 | A1* | 6/2016 | Wu | H01L 27/0922 257/369 |
| 2016/0379950 | A1* | 12/2016 | Tsai | H01L 24/11 257/737 |
| 2018/0053686 | A1* | 2/2018 | Hyun | H01L 27/11575 |
| 2019/0067294 | A1* | 2/2019 | Lee | H01L 27/10888 |
| 2019/0067454 | A1* | 2/2019 | Hsu | H01L 29/66795 |

FOREIGN PATENT DOCUMENTS

| JP | 2012-019035 A | 1/2012 |
| JP | 2014-216327 A | 11/2014 |
| WO | WO PCT/US2018/060892 | 3/2019 |

* cited by examiner

*Primary Examiner* — Victor A Mandala
(74) *Attorney, Agent, or Firm* — Wells St. John P.S.

(57) ABSTRACT

Some embodiments include an integrated assembly having a region of first semiconductor material. The region has an upper surface along a cross-section. The upper surface has a flat-topped peak and a concavity adjacent the flat-topped peak. A pillar of second semiconductor material is over the region and directly against the region. The pillar extends vertically from the upper surface. Some embodiments include a method of forming an integrated assembly. A construction is formed to have a semiconductor region, and to have an insulative region extending over the semiconductor region and alongside the semiconductor region. A combination of three etches is utilized to expose an upper surface of the semiconductor region and to modify the upper surface of the semiconductor region to form said upper surface to include, along a cross-section, a flat-topped peak portion and an adjacent concavity portion.

11 Claims, 11 Drawing Sheets

SEMICONDUCTOR ASSEMBLIES HAVING SEMICONDUCTOR MATERIAL REGIONS WITH CONTOURED UPPER SURFACES

TECHNICAL FIELD

Semiconductor assemblies having semiconductor material regions with contoured upper surfaces; and methods of forming semiconductor assemblies utilizing etching to contour upper surfaces of semiconductor material.

BACKGROUND

Integrated circuit fabrication may include fabrication of features (e.g., conductive pillars) over and directly against semiconductor material surfaces. In some applications, it may be difficult to access such semiconductor material surfaces due to adjacent structures limiting access to the surfaces. For instance, passing digit lines may limit access to semiconductor surfaces which are to be accessed for coupling with charge-storage structures (e.g., capacitors) during fabrication of memory. The difficulty increases with increasing levels of integration. Also, even when the surfaces can be accessed, there may be poor overlap of the features with the surfaces and/or there may be poor adhesion of the features to the surfaces. It would be desirable to develop new methods of fabrication which overcome at least some of the difficulties associated with forming features over and directly against semiconductor surfaces.

DETAILED DESCRIPTION OF THE ILLUSTRATED EMBODIMENTS

Some embodiments include methods for exposing regions of semiconductor material. Such methods may modify upper surfaces of the exposed regions to improve contact with additional materials which are subsequently formed over the regions. In some embodiments, the exposed regions are incorporated into integrated memory as interconnects extending to charge-storage devices (e.g., capacitors). Some embodiments include integrated circuitry having regions of semiconductor material with modified upper surfaces. Example embodiments are described with reference to FIGS. 1-12.

Figure 1:
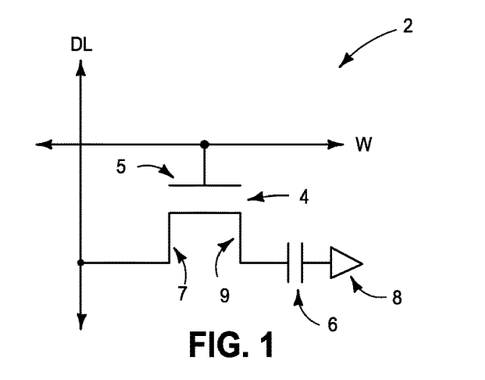
FIG. 1 is a schematic illustration of an example DRAM cell.

Referring to FIG. 1, an example DRAM (dynamic random-access memory) cell 2 is illustrated. The cell includes a FET (field effect transistor) 4 having a gate 5, and a pair of source/drain regions 7 and 9. The source/drain regions 7 and 9 may be considered to be gatedly coupled to one another through an electrical field imposed by the gate 5. The gate is electrically coupled with a wordline (i.e., access line) W, the source/drain region 7 is electrically coupled with a digit line (i.e., sense line, bitline) DL, and the source/drain region 9 is electrically coupled with a capacitor (i.e., charge-storage device) 6. The capacitor 6 has one node coupled with the source/drain region 9, and another node coupled with ground (or other suitable reference voltage) 8. In operation, a memory state of the memory cell 2 may correspond to a charge state of the capacitor 6.

Figure 2:
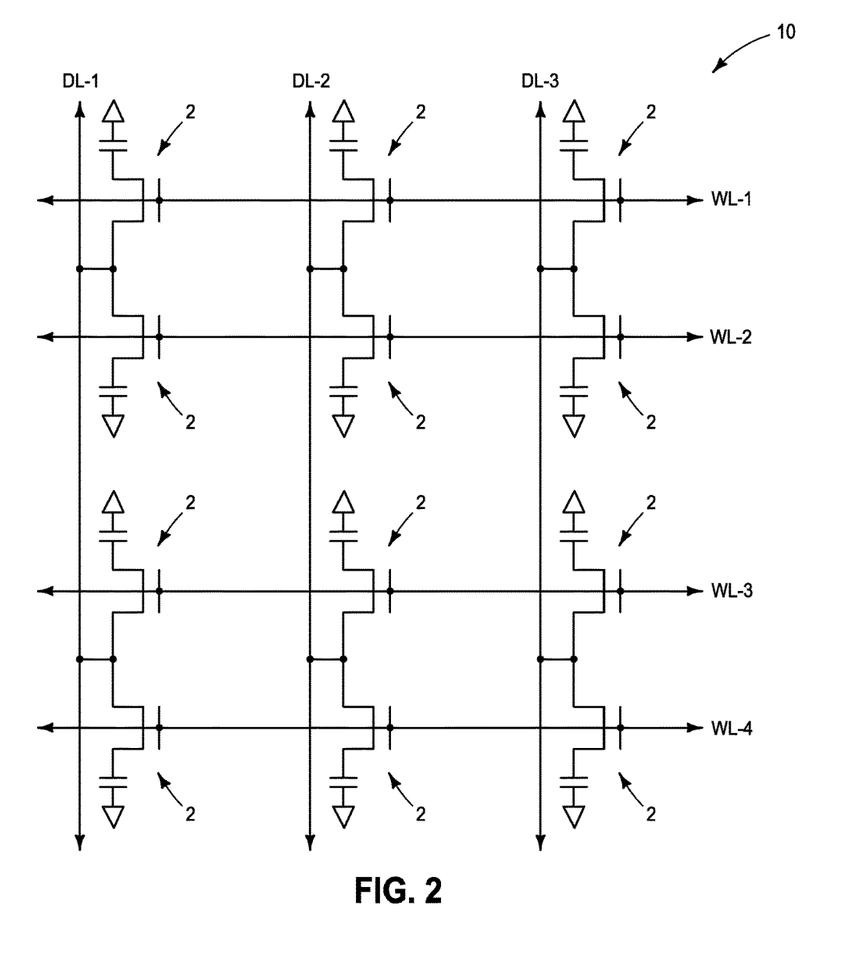
FIG. 2 is a schematic illustration of a region of an example DRAM array.

The DRAM cell 2 may be one of a plurality of substantially identical memory cells within an integrated memory array (with the term "substantially identical" meaning that the cells are identical to within reasonable tolerances of fabrication and measurement). FIG. 2 shows a region of an example memory array 10. The illustrated region includes wordlines (WL-1, WL-2, WL-3 and WL-4) and digit lines (DL-1, DL-2 and DL-3).

The memory cells 2 are arranged in pairs, with each pair of memory cells sharing a digit line connection.

Figure 3:
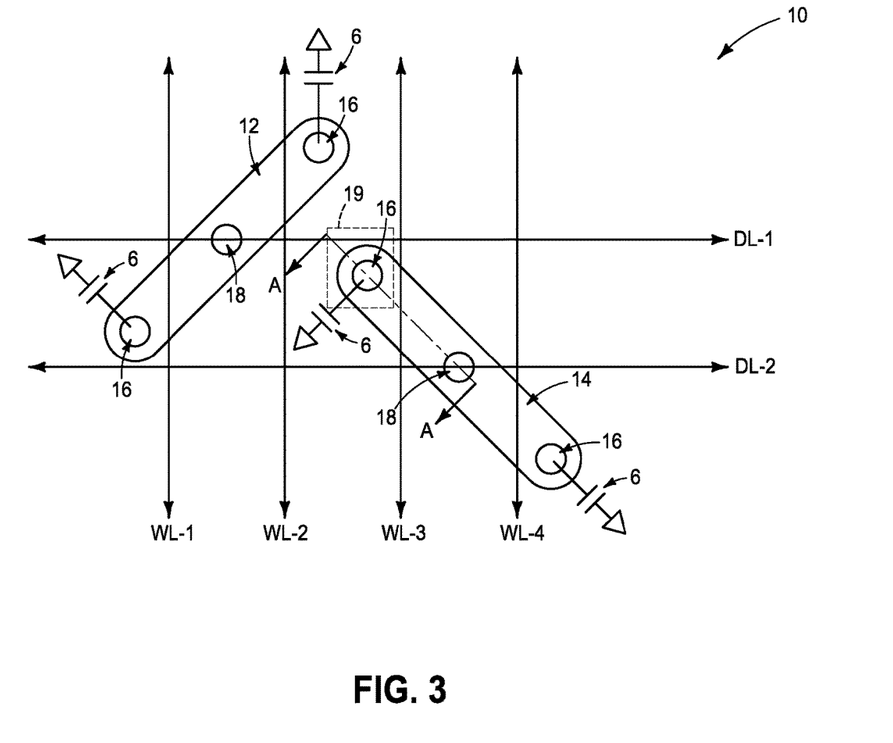
FIG. 3 is a diagrammatic top view of a region of a construction at a process stage during fabrication of an example DRAM array.

The memory array 10 of FIG. 2 may be highly integrated within an integrated construction. FIG. 3 shows a top view of an example integrated arrangement which may correspond to a region of the memory array 10. The arrangement includes a pair of illustrated active regions 12 and 14 (other active regions would be present, but are not shown in order to simplify the drawing). Each of the active regions 12 and 14 comprises two outer contact locations 16, and an inner (or central) contact location 18. The outer two contact locations 16 are electrically coupled with capacitors 6, and the inner contact locations 18 are electrically coupled with digit lines (DL-1 or DL-2). The wordlines WL-1, WL-2, WL-3 and WL-4 gatedly couple the capacitor contact locations 16 with the digit line contact locations 18.

A difficulty encountered in fabricating the arrangement of FIG. 3 is that digit lines pass near the capacitor contact locations and may render it difficult to access the capacitor contact locations. For instance, a region 19 of FIG. 3 has the digit line DL-1 passing near a capacitor contact location 16 associated with the active region 14. The digit line DL-1 may impede access to such capacitor contact location.

Figure 4:
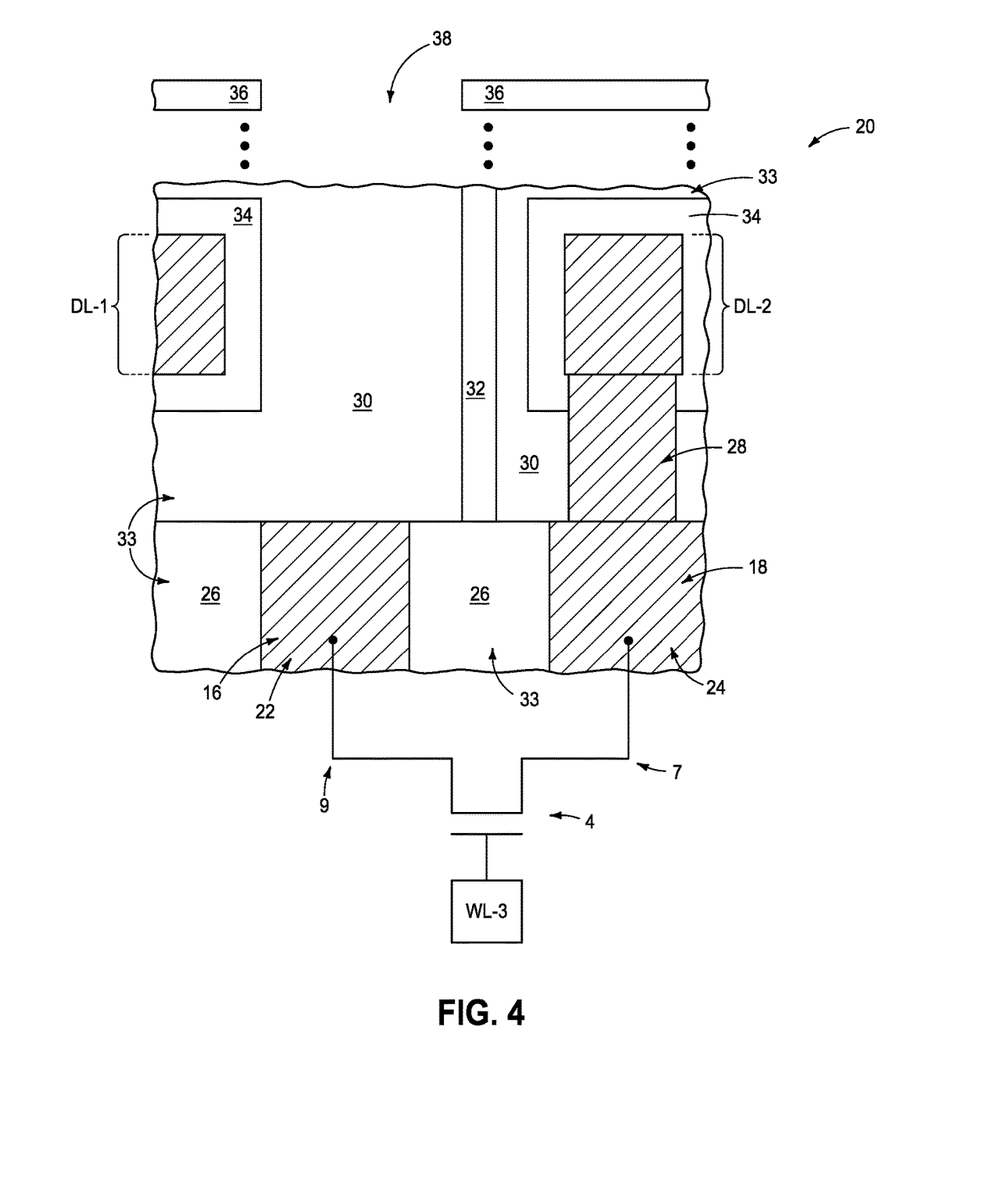
FIG. 4 is a diagrammatic cross-sectional side view of a portion of the construction of FIG. 3; and is a view along a line A-A of FIG. 3.

FIG. 4 shows a cross-sectional side view of a construction 20 (i.e., an integrated assembly). The view of FIG. 4 is along the line A-A of FIG. 3; and illustrates a process stage during fabrication of the memory array 10.

The construction 20 includes a pair of semiconductor regions 22 and 24 which are spaced from one another by insulative material 26.

The semiconductor regions 22 and 24 may comprise monocrystalline silicon. In some embodiments, the semiconductor regions 22 and 24 may extend to bulk semiconductor material of a semiconductor substrate. The term "semiconductor substrate" means any construction comprising semiconductive material, including, but not limited to, bulk semiconductive materials such as a semiconductive wafer (either alone or in assemblies comprising other materials), and semiconductive material layers (either alone or in assemblies comprising other materials). The term "substrate" refers to any supporting structure, including, but not limited to, the semiconductor substrates described above.

The semiconductor regions 22 and 24 may be conductively doped. In some embodiments, the regions 22 and 24 may be n-type doped regions, and in other embodiments they may be p-type doped regions.

The regions 22 and 24 are shown coupled with source/drain regions (9 and 7) of a transistor 4. Ultimately, the regions 22 and 24 are coupled with a capacitor (or other suitable charge-storage device) and a digit line, respectively; and correspond to the capacitor contact location 16 and the digit line contact location 18, respectively, along the section A-A of FIG. 3. The transistor 4 of FIG. 4 has a gate which is electrically coupled with the wordline WL-3. The transistor gatedly couples the regions 22 and 24 with one another. The transistor 4 may be present at the processing stage of FIG. 4 (as shown), or may be formed at a subsequent process stage.

The region 24 is electrically coupled with the digit line DL-2 through a conductive interconnect 28. Such conductive interconnect may comprise any suitable electrically conductive composition(s), such as, for example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.).

The digit line DL-2 may comprise any suitable electrically conductive composition(s); and in some embodiments may comprise a stack containing semiconductor material (e.g., conductively-doped silicon) and one or more of various metals and/or metal-containing compositions.

Insulative material 30 is over the regions 22 and 24. The insulative material 30 may comprise a same composition as the insulative 26. For instance, in some embodiments the insulative materials 26 and 30 may both comprise, consist essentially of, or consist of silicon dioxide. In other embodiments, the insulative 30 may comprise a different composition relative to the material 26. Regardless, the materials 26 and 30 may be considered together to form an insulative region 33 which extends over the semiconductor regions 22 and 24, and alongside such semiconductor regions.

Another insulative material 32 extends through the insulative material 30. The insulative material 32 may comprise a composition which is resistant to an etch subsequently utilized to remove the material 30. In some embodiments, the insulative material 32 may comprise, consist essentially of, or consist of silicon nitride.

The digit line DL-1 is shown passing near the semiconductor region 22, and impeding access to such semiconductor region. The digit line DL-1 may comprise any of the compositions described above relative to the digit line DL-2.

Insulative material 34 is between the conductive materials of the digit lines DL-1 and DL-2, and the insulative material 30. In some embodiments, the insulative 30 may comprise an oxide (e.g., silicon dioxide), and the insulative material 34 is utilized as a barrier to protect the digit lines from being directly exposed to the oxide of the insulative material 30. In some embodiments, the insulative material 34 may comprise, consist essentially of, or consist of silicon nitride. In some embodiments, the insulative material 34 surrounding the digit line DL-1 along the cross-section of FIG. 4 may be considered to be an insulative shell extending around the digit line DL-1.

In some embodiments, the semiconductor region 22 may be considered to be a first region, the insulative region 33 may be considered to be a second region, and the insulative material 34 and digit line DL-1 may be together considered as a third region.

The digit line DL-1 is laterally displaced from being directly over the semiconductor region 22. Accordingly, although the digit line DL-1 impedes access to the region 22, the digit line does not entirely block access to such region.

In some embodiments, the digit lines DL-1 and DL-2 may be referred to as first and second digit lines, respectively.

Masking material 36 is provided over construction 20 and defines a location for an opening 38 which will ultimately expose the semiconductor region 22. A gap is provided between the construction 20 and the masking material 36 to indicate that there may be a distance between the illustrated portion of construction 20 and the masking material 36, and to indicate that there may be other materials and/or components between the illustrated portion of construction 20 and the masking material 36. The masking material 36 may comprise any suitable composition(s), and in some embodiments may comprise photolithographically-patterned photoresist and/or one or more hard-mask materials.

Figure 5:
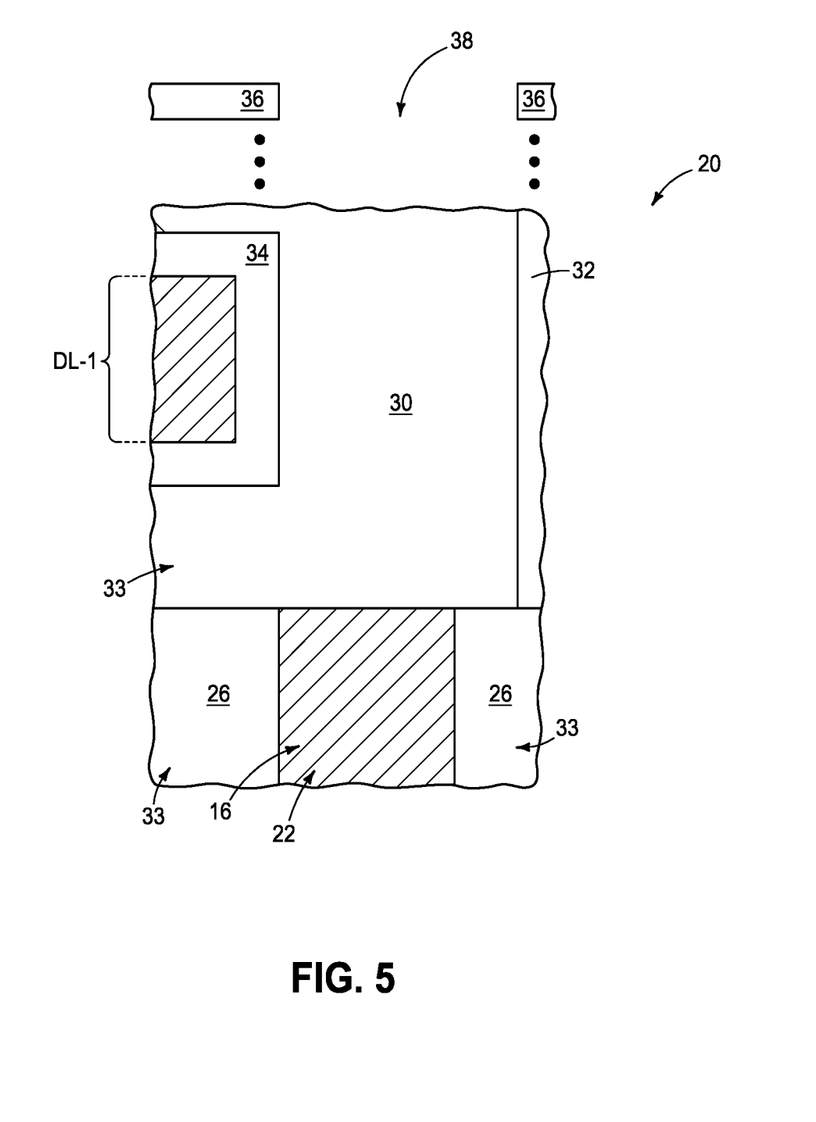
FIG. 5 is a diagrammatic cross-sectional side view of a portion of the construction of FIG. 3.

FIG. 5 shows a portion of the construction 20 of FIG. 4. Some embodiments include methods of exposing and contouring an upper surface of the semiconductor region 22, and the view of FIG. 5 shows a relevant portion of construction 20 to explain such aspects. The coupling of region 22 to the source/drain region of transistor 4 (FIG. 4) is not shown in FIG. 5. Such coupling may be present at the process stage of FIG. 5 in some embodiments, and may be provided at a later process stage in other embodiments.

Figure 6:
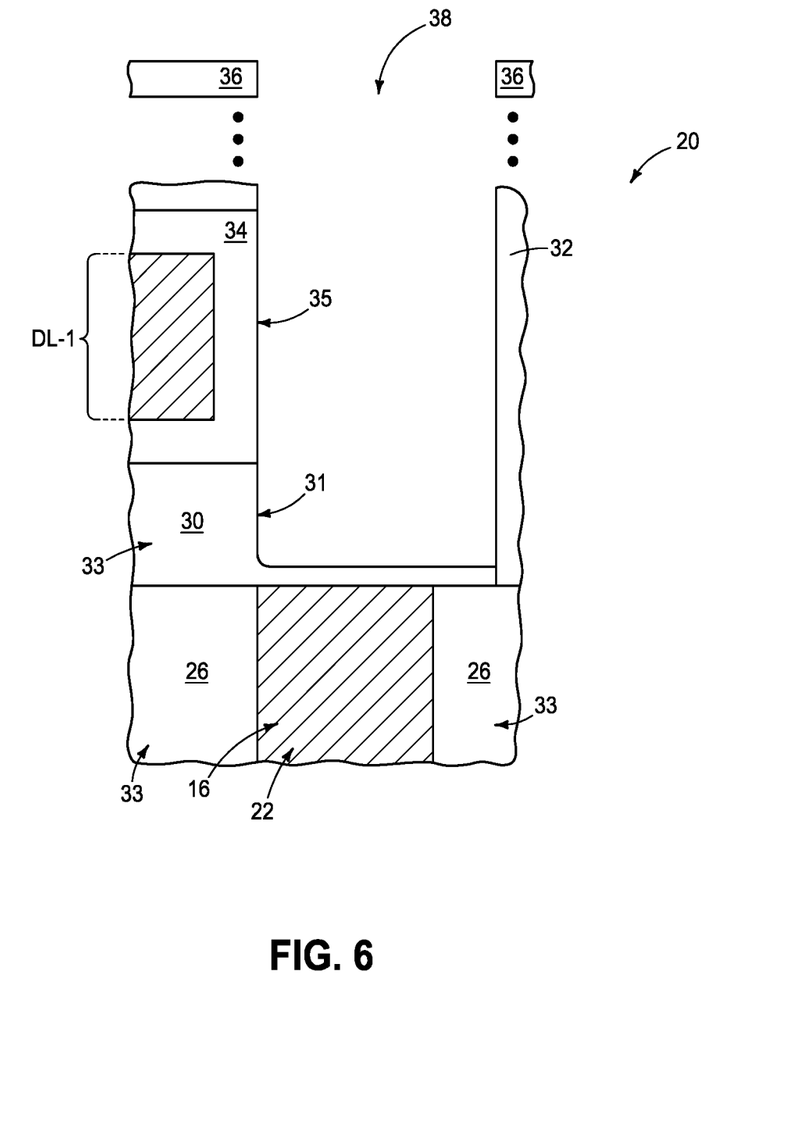
FIGS. 6-8 and 10-11 are diagrammatic cross-sectional side views of the portion of FIG. 5 at example process stages of an example embodiment.

Referring to FIG. 6, the opening 38 is extended into the insulative region 33. Such may be accomplished with any suitable etch, or combination of etches. The etching is selective for material 30 relative to materials 32 and 34 (with the term "selective etch" meaning an etch which removes one material faster than another; and which includes, but is not limited to, etches which are 100% selective for one material relative to another). In some embodiments, the insulative material 30 comprises silicon dioxide, and the materials 32 and 34 both comprise silicon nitride. The silicon dioxide may be selectively removed relative to the silicon nitride utilizing, for example, hydrofluoric-acid-based etch chemistries.

The processing stage of FIG. 6 shows a portion of the insulative region 33 removed to expose a sidewall 35 of material 34, and to reduce a thickness of the insulative region over the semiconductor region 22. Although the illustrated processing stage has a substantially plumb surface 31 along the material 30 and coextensive with the sidewall surface 35 of material 34, in other embodiments the surface 31 may partially undercut material 34 and/or may be angled.

Figure 7:
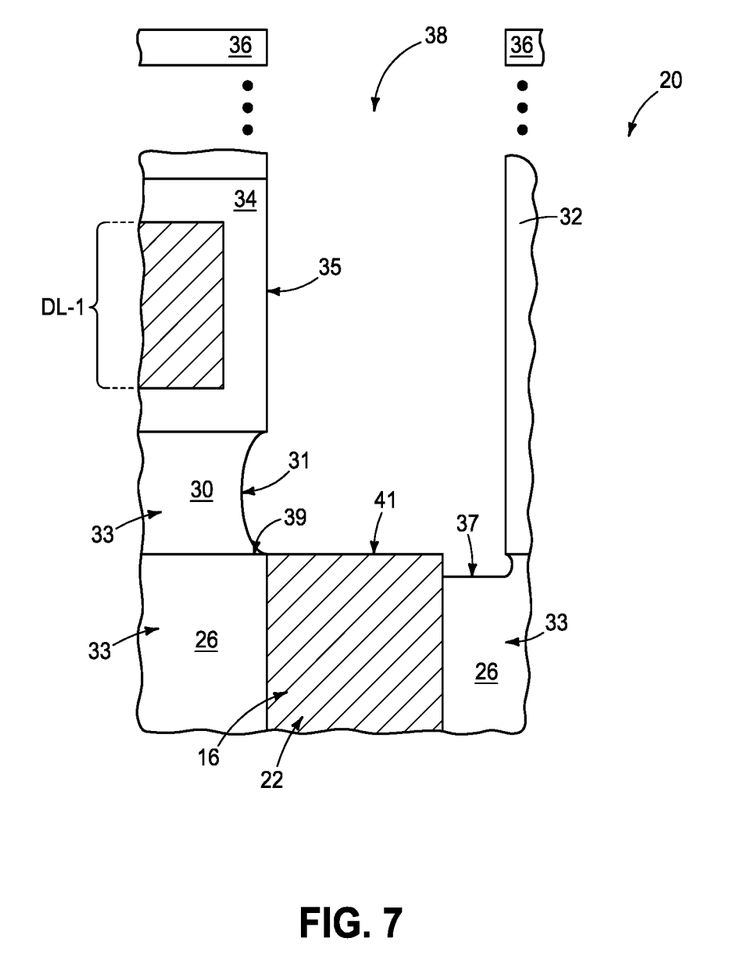

Referring to FIG. 7, the materials 26 and 30 of insulative region 33 are subjected to additional etching which selectively removes such materials relative to the semiconductor material of region 22 and the insulative materials 32/34. In some embodiments, the materials 26 and 30 may both comprise silicon dioxide, material 22 may comprise silicon, and the materials 32 and 34 may comprise silicon nitride. In such embodiments, the materials 26 and 30 may be selectively removed utilizing one or both of a wet etch with a hydrofluoric-acid-comprising etchant, and a vapor etch with a hydrofluoric-acid-comprising etchant.

The wet etch may be a buffered oxide etch (BOE), and the etchant may comprise, for example, ammonium fluoride and surfactants in combination with the hydrofluoric acid. The wet etch may be conducted under any suitable conditions, and in some embodiments will be conducted at a temperature of at least about 25° C. (i.e., room temperature).

The vapor etch may or may not utilize plasma. If plasma is utilized, the plasma may be a remote plasma (i.e., a plasma which generates desired species for the etch, but which does not contact surfaces of construction 20). The etchant of the vapor etch may include ammonia ($NH_3$) in addition to the hydrofluoric acid. The ratio of hydrofluoric acid to ammonia may be within a range of from about 1:1 (mole:mole) to about 5:1 (mole:mole). In some embodiments, the vapor etch may include one or more of $NH_3$, $HF$ and $NF_3$.

In some embodiments, the vapor etch may utilize at least at least one cycle (and in some embodiments at least three cycles) of a two-step process. The first step is conducted at a temperature within a range of from about 25° C. to about 100° C., and utilizes hydrofluoric-acid-comprising etchant to remove materials 26 and 30 of insulative region 33. The second step is conducted at a temperature within a range of from about 100° C. to about 250° C. under vacuum to remove etch by-products. If remote plasma is utilized, such may be utilized for only the first of the two steps.

The etching recesses the surface 31 to under the material 34 along the digit line DL-1. In some embodiments, such recess may extend to under the digit line. In the shown embodiment, the etching has recessed (i.e., inset) a surface 37 of material 26 along an illustrated right side of semiconductor region 22, and has not inset an analogous surface 39 of the insulative material 26 along an illustrated left side of the semiconductor region 22. In other embodiments, the surface 31 may be further recessed than is shown in FIG. 7, and such may expose the surface 39 so that such is inset in a manner analogous to the inset shown relative to surface 37.

The etching of FIG. 7 also exposes an upper surface 41 of the semiconductor region 22.

Figure 8:
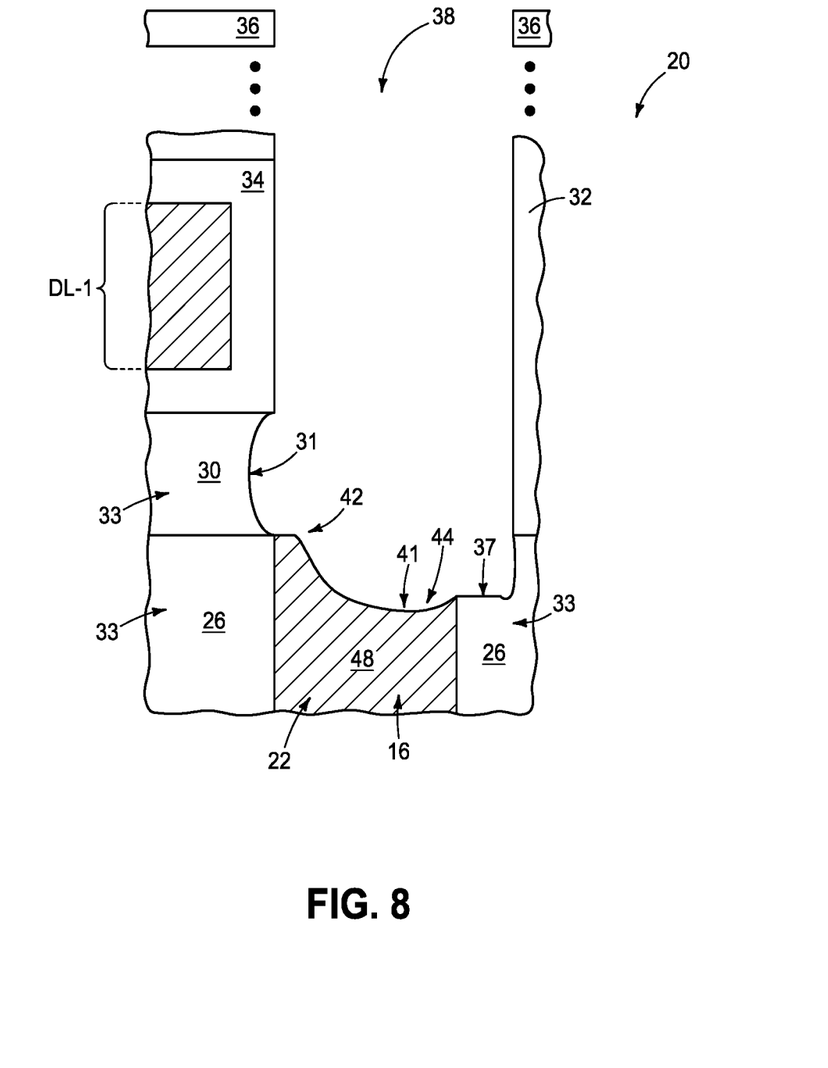

Referring to FIG. 8, a silicon etch is utilized to modify the upper surface 41 of the semiconductor region 22. The modified upper surface includes a flat-topped (or at least substantially flat-topped) peak portion 42 (also referred to herein as a peak) and a concavity portion 44 (also referred to herein as a concavity). Such will be described in more detail below with reference to FIG. 12. The dimension of the flat horizontal portion (i.e., the flat top) of the peak portion 42 may be determined, at least in part, by the digit line (DL-1) stack misalignment on the insulating surface 26 of FIG. 7. Although the illustrated peak portion 42 has a substantially planar top that extends horizontally, in other embodiments the peak portion may have other configurations (e.g., the flat top may be along a slope tilted relative to the horizontal direction, etc.). The flat top may be absolutely flat, or may be substantially flat; with the term "substantially flat" meaning flat (i.e., planar) to within reasonable tolerances of fabrication and measurement.

The etching utilized at the processing stage of FIG. 8 may use ammonia to remove some of the silicon of the semiconductor region. The etching may or may not utilize a plasma. If plasma is utilized, such may be a remote plasma. The etching may be conducted at a temperature of at least 250° C. for a time of at least about two minutes. In some embodiments, the etchant may include forming gas mixture (i.e., ammonia-forming-gas) in addition to the ammonia; where the mole fraction of ammonia may be within a range of from about 0.1 to about 0.5. In some embodiments, the etchant may include ammonia-forming gas and/or oxygen-tetrafluoromethane mixtures.

Figure 9:
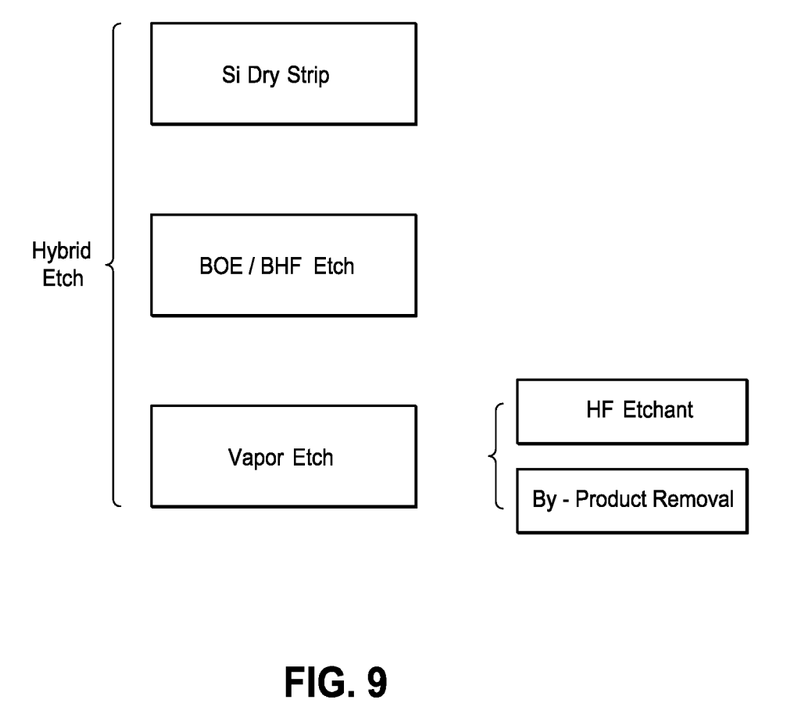
FIG. 9 is a diagrammatic illustration of an example etch strategy.

The etching processes of FIGS. 7 and 8 may be together considered to constitute a hybrid etching process. Such hybrid etching process utilizes three etches to expose the upper surface of the semiconductor region 22, and to modify such upper surface. The three etches are a silicon etch with an ammonia-comprising etchant, a wet etch with a hydrofluoric-acid-comprising etchant, and a vapor etch with a hydrofluoric-acid-comprising etchant. Such concept is illustrated in FIG. 9. The silicon etch is described as a "Si dry strip", the wet etch is described as a "BOE/BHF etch" (i.e., buffered oxide etch, or buffered hydrofluoric acid etch), and the vapor etch is described as a "vapor etch". Further, the vapor etch is shown to comprise the two-step cycle; with the first step utilizing of the HF etchant, and the second step being by-product removal. The vapor etch may utilize three or more of such cycles. The three etches of the hybrid etch may be done in any suitable order. Further, one or more of the etches may be utilized more than once in an etch sequence.

In some embodiments, synergies may be recognized between the etches of the hybrid etching process. For instance, the silicon etching may utilize reducing conditions during the dry strip, which may decrease the oxygen concentration in surrounding nitride films and thereby decrease nitride loss during subsequent hydrofluoric-acid-comprising etches. The wet etch may utilize surfactant to decrease surface tension and improve surface wettability for efficient etching/cleaning. A rinse (for instance, a deionized water rinse) may be inserted between cyclic wet etching processes to mitigate mass-transfer limitations while oxide etching is conducted within a high-aspect-ratio opening. Further, the BOE/BHF wet etch may cause some pitting of an exposed silicon surface, which may decrease resistance along an interface between the surface 41 of semiconductor region 22 and an additional semiconductor material which is subsequently formed along such surface (with such additional semiconductor material being, for example, the material 50 of FIG. 10). The heat treatment utilized to remove by-products during the vapor etch may heal exposed nitride film, and may thus decrease nitride loss.

In some embodiments, the hybrid etching process may be cost-effective as compared to conventional processes. For instance, conventional processes may attempt to utilize a vapor etch analogous to that of the hybrid etching process, but in the absence of the other etches which are included in the hybrid process of FIG. 9. Such conventional processes utilize many more vapor-etch cycles to accomplish a same amount of oxide removal as can be accomplished with the hybrid process and fewer vapor-etch cycles. Further, the conventional processes do not achieve the modification of the surface of semiconductor material 22 which is advantageously achieved utilizing the hybrid etching process described herein.

Figure 10:
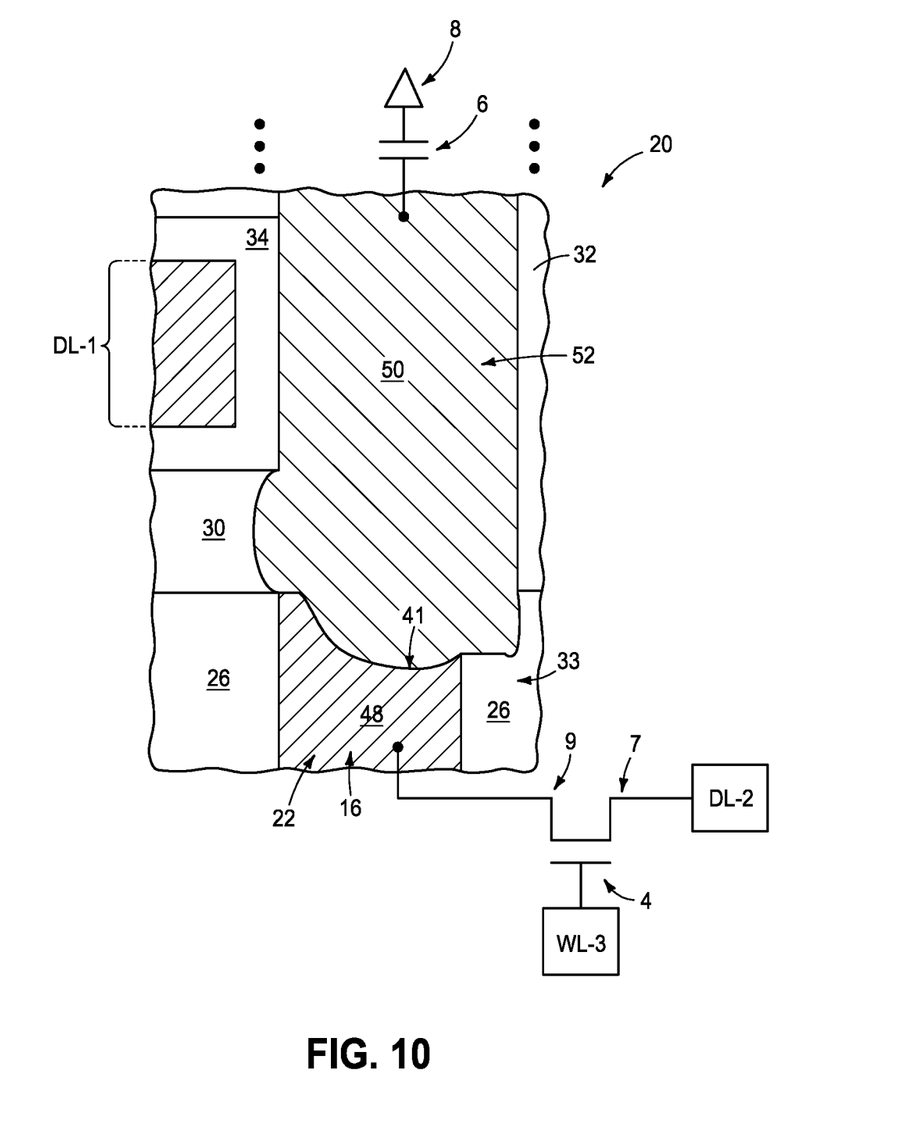

Referring to FIG. 10, the masking material 36 (FIG. 8) is removed, and semiconductor material 50 is formed within the opening 38 (FIG. 8). The semiconductor material 50 contacts the upper surface 41 of semiconductor region 22, and thus directly contacts the semiconductor material of semiconductor region 22.

The semiconductor material 50 may comprise any suitable composition(s); and in some embodiments may comprise one or more of silicon, germanium, III/V semiconductor material (e.g., gallium phosphide), semiconductor oxide, etc. The term "III/V semiconductor" material means semiconductor material comprising elements from groups III and V of the periodic table.

In some embodiments, the semiconductor region 22 may be considered to comprise a first semiconductor material 48, and the semiconductor material 50 may be considered to be a second semiconductor material which is deposited over the first semiconductor material. The second semiconductor material 50 is configured as a pillar 52 which extends vertically from the upper surface 41 of the first semiconductor material 48.

In some embodiments, the first and second semiconductor materials 48 and 50 both comprise silicon, and may differ from one another in crystallinity. For instance, the material 48 may comprise monocrystalline silicon, and the material 50 may be deposited as polycrystalline silicon.

In some embodiments, the first and second semiconductor materials 48 and 50 may comprise different elements relative to one another. For instance, the first semiconductor material 48 may comprise silicon; and the second semiconductor material 50 may comprise one or more of germanium, III/V semiconductor material and semiconductor oxide.

The second semiconductor material 50 extends to under the insulative material 34 surrounding the digit line DL-1. In some embodiments, the recessing of material 32 under the digit line DL-1 may be sufficient so that the semiconductor material 50 extends to under the conductive material of the digit line DL-1.

FIG. 10 diagrammatically shows the capacitor 6 electrically coupled with the vertical pillar 52 of semiconductor material 50, and shows the source/drain region 9 of the transistor 4 coupled with the semiconductor material 48 of region 22. In some embodiments, the semiconductor materials 48 and 50 are conductively-doped, and the capacitor 6 is gatedly coupled with the digit line DL-2 through a conductive path which includes the first and second semiconductor materials 48 and 50.

Figure 11:
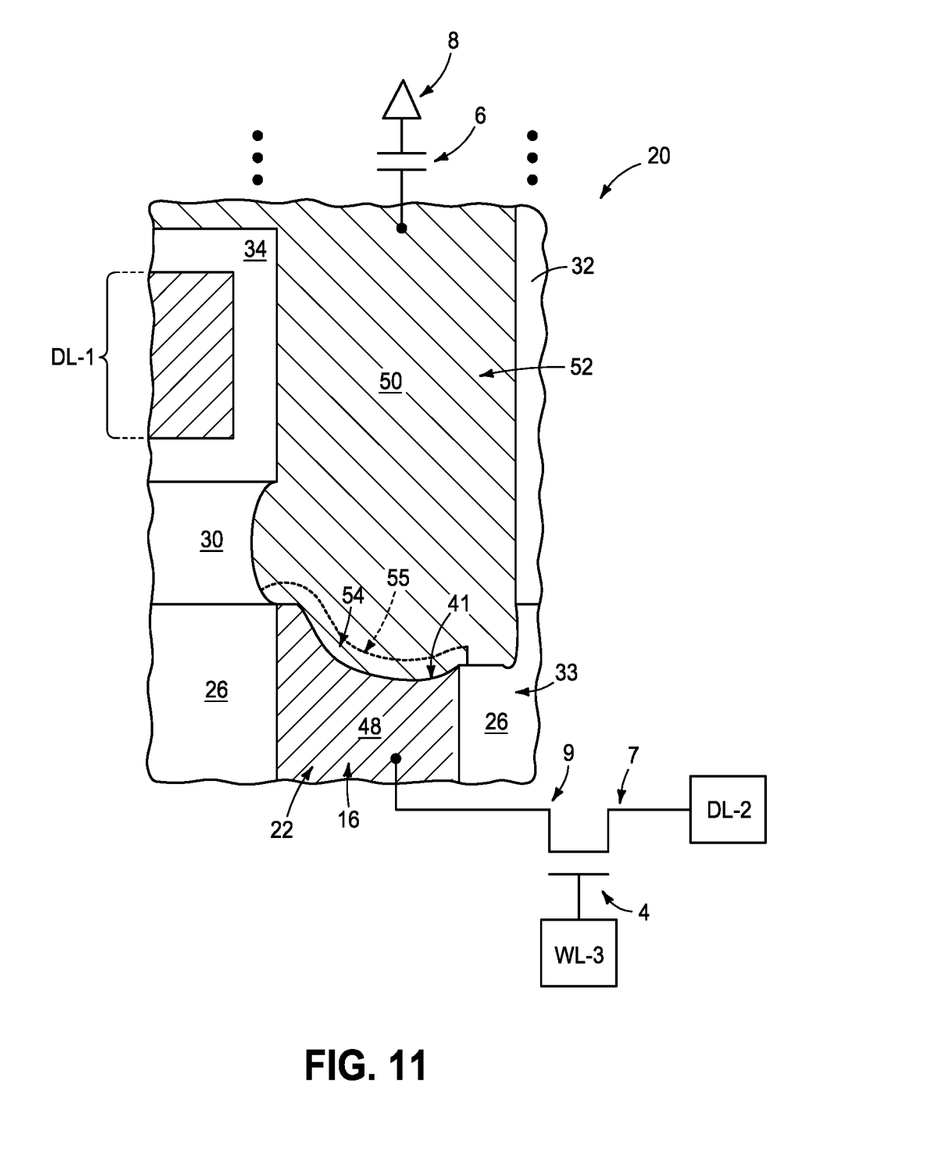

In some embodiments, the semiconductor material 50 comprises silicon, and the deposition of the material 50 epitaxially grows a first region of the material along the upper surface of the monocrystalline silicon 48, and then a remainder of the material 50 forms as polycrystalline silicon. Such is illustrated in FIG. 11, where a bottom region of material 50 is shown to be a monocrystalline silicon region 54, and a dashed-line 55 is provided to illustrate an approximate boundary between the monocrystalline silicon region 54 and the remaining polycrystalline silicon of material 50.

Figure 12:
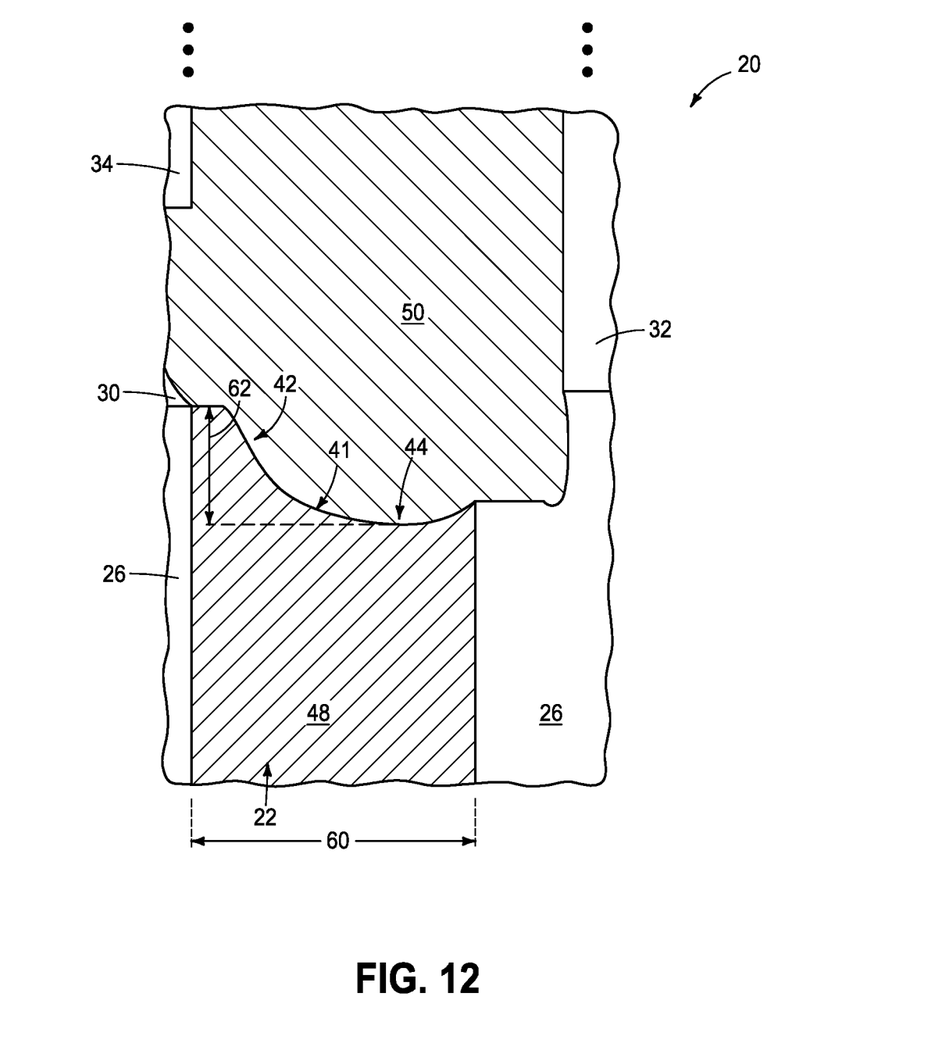
FIG. 12 is an enlarged view of a region of the construction of FIG. 10.

The hybrid etching described above with reference to FIGS. 7-9 may provide a contoured upper surface 41 of semiconductor region 22 suitable for making a desired high-quality electrical contact with semiconductor material 50, and also suitable for obtaining desired strong adhesion with semiconductor material 50. FIG. 12 shows an enlarged region of the construction 20 of FIG. 10, and illustrates an example contour formed along the upper surface 41 of semiconductor region 22.

The region 22 may have any suitable width 60; and in some embodiments may have a width of from about 130 angstroms (Å) to about 200 Å along the illustrated cross-section of FIG. 12. The flat-topped peak 42 is along one edge of the width of semiconductor region 22 relative to the illustrated cross-section, and the concavity 44 is adjacent the flat-topped peak and extends along the remainder of the width of the semiconductor region 22 relative to the illustrated cross-section. The flat-topped peak 42 may have any suitable height; and in some embodiments a distance 62 from the top of the peak 42 to the bottom of the concavity 44 is within a range of from about 20 Å to about 50 Å.

The assemblies and structures discussed above may be utilized within integrated circuits (with the term "integrated circuit" meaning an electronic circuit supported by a semiconductor substrate); and may be incorporated into electronic systems. Such electronic systems may be used in, for example, memory modules, device drivers, power modules, communication modems, processor modules, and application-specific modules, and may include multilayer, multi-chip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

Unless specified otherwise, the various materials, substances, compositions, etc. described herein may be formed with any suitable methodologies, either now known or yet to be developed, including, for example, atomic layer deposition (ALD), chemical vapor deposition (CVD), physical vapor deposition (PVD), etc.

The terms "dielectric" and "insulative" may be utilized to describe materials having insulative electrical properties. The terms are considered synonymous in this disclosure. The utilization of the term "dielectric" in some instances, and the term "insulative" (or "electrically insulative") in other instances, may be to provide language variation within this disclosure to simplify antecedent basis within the claims that follow, and is not utilized to indicate any significant chemical or electrical differences.

The particular orientation of the various embodiments in the drawings is for illustrative purposes only, and the embodiments may be rotated relative to the shown orientations in some applications. The descriptions provided herein, and the claims that follow, pertain to any structures that have the described relationships between various features, regardless of whether the structures are in the particular orientation of the drawings, or are rotated relative to such orientation.

The cross-sectional views of the accompanying illustrations only show features within the planes of the cross-sections, and do not show materials behind the planes of the cross-sections, unless indicated otherwise, in order to simplify the drawings.

When a structure is referred to above as being "on", "adjacent" or "against" another structure, it can be directly on the other structure or intervening structures may also be present. In contrast, when a structure is referred to as being "directly on", "directly adjacent" or "directly against" another structure, there are no intervening structures present.

Structures (e.g., layers, materials, etc.) may be referred to as "extending vertically" to indicate that the structures generally extend upwardly from an underlying base (e.g., substrate). The vertically-extending structures may extend substantially orthogonally relative to an upper surface of the base, or not.

Some embodiments include an integrated assembly having first conductive material with an upper surface. The upper surface comprises a first portion and a second portion that is concave downwardly from the first portion. Second conductive material is over the first conductive material. The second conductive material extends vertically from the first and second portions of the upper surface of the first conductive material. Each of the first and second materials may comprise semiconductor material. The first portion of the upper surface of the first conductive material may provide a substantially flat surface, and the second portion of the upper surface of the first conductive material may provide a concavity surface. The first conductive material may serve as one of source and drain regions of an access transistor in a memory cell, and the second conductive material may intervene between the first conductive material and a lower electrode of a capacitor in the memory cell.

Some embodiments include an integrated assembly having a region of first semiconductor material. The region has a width along a cross-section, with the width being within a range of from about 130 Å to about 200 Å. The region has an upper surface along the cross-section. The upper surface has a flat-topped peak along one edge of the width and has a concavity adjacent the flat-topped peak. A distance from the top of the flat-topped peak to the bottom of the concavity is within a range of from about 20 Å to about 50 Å. A pillar of second semiconductor material is over said region and directly against said region. The pillar extends vertically from said upper surface.

Some embodiments include a method of forming an integrated assembly. A construction is formed to have a semiconductor region, and to have an insulative region extending over the semiconductor region and alongside the semiconductor region. The construction includes a third region above the semiconductor region and laterally displaced from being directly over the semiconductor region. The semiconductor region comprises a first semiconductor material, with the first semiconductor material being silicon. The insulative region comprises silicon dioxide. A portion of the insulative region is removed to expose a sidewall of the third region, and to reduce a thickness of the insulative region over the semiconductor region. A combination of three etches is utilized to expose an upper surface of the semiconductor region and to modify the upper surface of the semiconductor region to form said upper surface to include, along a cross-section, a flat-topped peak portion and an adjacent concavity portion. The three etches are a silicon etch with an ammonia-comprising etchant, a wet etch with a hydrofluoric-acid-comprising etchant, and a vapor etch with a hydrofluoric-acid-comprising etchant. A second semiconductor material is formed over and directly against the modified upper surface of the semiconductor region.

Some embodiments include a method of forming an integrated assembly. A construction is formed to have a semiconductor region, and to have an insulative region extending over the semiconductor region and alongside the semiconductor region. The construction includes a first digit line above the semiconductor region and laterally displaced from being directly over the semiconductor region. The semiconductor region comprises a first semiconductor material, with the first semiconductor material being silicon. An insulative shell extends around the first digit line. The insulative shell comprises silicon nitride and the insulative region comprises silicon dioxide. A portion of the insulative region is removed to expose a sidewall of the insulative shell and to reduce a thickness of the insulative region over the semiconductor region. A combination of etches is used to expose an upper surface of the semiconductor region and to modify the upper surface of the semiconductor region to form said upper surface to include, along a cross-section, a flat-topped peak portion and an adjacent concavity portion. The semiconductor region has a width along the cross-section which is within a range of from about 130 Å to about 200 Å. A distance from the top of the flat-topped peak portion to the bottom of the concavity portion is within a range of from about 20 Å to about 50 Å. At least one of the etches of said combination of etches utilizes ammonia to remove some of the silicon of the semiconductor region, and at least one of the etches of said combination of etches utilizes hydrofluoric acid to remove silicon dioxide of the insulative region. A second semiconductor material is formed over and directly against the modified upper surface of the semiconductor region. A capacitor is formed over the second semiconductor material. The capacitor is gatedly coupled with a second digit line through a conductive path which includes the first and second semiconductor materials.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

We claim:
1. An integrated assembly, comprising:
a region of first semiconductor material; said region having a width along a cross-section; said region having an upper surface along the cross-section, with the upper surface having a flat-topped peak along one edge of the width, and having a concavity adjacent the flat-topped peak; and
a pillar of second semiconductor material over said region and directly against said region; the pillar extending vertically from said upper surface.
2. The integrated assembly of claim 1 wherein the width is within a range of from 130 Å to 200 Å; and wherein a distance from the top of the flat-topped peak to the bottom of the concavity is within a range of from 20 Å to 50 Å.
3. The integrated assembly of claim 1 wherein the first and second semiconductor materials are conductively doped; wherein a first digit line is laterally adjacent the second semiconductor material, and is laterally spaced from the second semiconductor material by a region of silicon nitride; and wherein a capacitor is over the second semiconductor material and is gatedly coupled with a second digit line through a conductive path which includes the first and second semiconductor materials.
4. The integrated assembly of claim 3 wherein a portion of the second semiconductor material extends to under the region of the silicon nitride.
5. The integrated assembly of claim 1 wherein the first semiconductor material comprises silicon.
6. The integrated assembly of claim 1 wherein the first and second semiconductor materials comprise silicon and differ from one another in crystallinity.
7. The integrated assembly of claim 1 wherein the first and second semiconductor materials comprise different elements relative to one another.
8. The integrated assembly of claim 7 wherein the first semiconductor material comprises silicon, and wherein the second semiconductor material comprises one or more of germanium, III/V semiconductor material and semiconductor oxide.
9. The integrated assembly of claim 1 wherein the first semiconductor material comprises monocrystalline silicon.
10. The integrated assembly of claim 9 wherein the second semiconductor material comprises polycrystalline silicon.
11. An integrated assembly, comprising:
first conductive material having an upper surface, wherein the upper surface comprises a first portion and a second portion that is concave downwardly from the first portion;
second conductive material over the first conductive material, wherein the second conductive material extends vertically from the first and second portions of the upper surface of the first conductive material; and
wherein the first conductive material serves as one of source and drain regions of an access transistor in a memory cell, and the second conductive material intervenes between the first conductive material and a lower electrode of a capacitor in the memory cell.

* * * * *